United States Patent [19]

Kuniyoshi et al.

[11] Patent Number: 4,964,146
[45] Date of Patent: Oct. 16, 1990

[54] PATTERN TRANSISTOR MASK AND METHOD OF USING THE SAME

[75] Inventors: Shinji Kuniyoshi; Takeshi Kumura, both of Tokyo, Japan

[73] Assignee: Hitachi, Ltd., Tokyo, Japan

[21] Appl. No.: 324,977

[22] Filed: Mar. 15, 1989

Related U.S. Application Data

[63] Continuation of Ser. No. 7,268,202, Nov. 7, 1988, abandoned, which is a continuation of Ser. No. 6,888,862, Jul. 23, 1986, abandoned.

[30] Foreign Application Priority Data

Jul. 31, 1985 [JP] Japan .................. 60-167560

[51] Int. Cl.$^5$ .................. G21K 5/00
[52] U.S. Cl. .................. 378/35; 378/34; 378/205; 378/206; 250/491.1; 250/492.24; 350/164; 350/166; 356/401
[58] Field of Search .................. 378/34, 35, 205, 206; 250/491.1, 492.24; 430/5; 350/1.6, 164, 166; 356/401

[56] References Cited

U.S. PATENT DOCUMENTS

| | | | |
|---|---|---|---|
| 3,720,143 | 3/1973 | Hashimoto et al. | 430/5 |
| 3,758,326 | 9/1973 | Hennings et al. | 430/5 |
| 3,892,973 | 7/1975 | Coquin et al. | 378/34 |
| 4,022,927 | 5/1977 | Pfeiffer et al. | 378/35 |
| 4,293,624 | 10/1981 | Buckley | 378/35 |
| 4,306,006 | 12/1981 | Descamps et al. | 430/5 |
| 4,472,824 | 9/1984 | Buckley | 378/205 |
| 4,587,184 | 5/1986 | Schneider-Gmelch et al. | 378/34 |
| 4,647,517 | 3/1987 | Hersener et al. | 378/35 |

FOREIGN PATENT DOCUMENTS 0090924 10/1983 European Pat. Off. .................. 430/5

OTHER PUBLICATIONS

"High Transmission X-Ray Masks for Lithographic Applications", by Bassons et al., Solid State Tech., 9/1976, 378/35.
"Mask to Wafer Alignment System", by Feder et al., IBM Technical Disclosure Bulletin, vol. 16 #4, 9/1973, p. 1307, 378/34.
"Method for Aligning Circuits on Substrates", by Angilello IBM Technical Disclosure Bulletin, vol. 22 #6, 11/1979, 378/34.
"Mask to Wafer Alignment System", by Feder et al., IBM Technical Disclosure Bulletin, vol. 16 #4, 9/1973, p. 1306, 378/34.

*Primary Examiner*—Craig E. Chruch
*Assistant Examiner*—John C. Freeman
*Attorney, Agent, or Firm*—Antonelli, Terry, Stout & Kraus

[57] ABSTRACT

Alignment in X-ray lithography is generally effected in such a manner that the surface of a target mark for alignment formed on a wafer is illuminated with light for alignment through an X-ray mask, and the position of the wafer is detected from the reflected light. On the basis of the finding that the reflected light from the mask, particularly from an absorber formed thereon, greatly degrades the precision and reliability in measurement, the present invention provides a pattern transfer mask provided with a thin film which lowers the reflection factor of the mask the thin film having a thickness set a $\lambda/4n$ ($\lambda$:the wavelength of the light for alignment; n: an integer) or an odd-number multiple thereof. Thus, it is advantageously possible to overcome the above-described lowering of precision and reliablity.

9 Claims, 3 Drawing Sheets

PATTERN TRANSISTOR MASK AND METHOD OF USING THE SAME

This application is a continuation of application Ser. No. 268,202, filed Nov. 7, 1988; which is a continuation of application Ser. No. 888,862, filed July 23, 1986.

BACKGROUND OF THE INVENTION

The present invention relates to a lithographic technique for transferring a precise pattern such as an integrated circuit pattern. More particularly, the present invention pertains to a pattern transfer mask which enables alignment between a wafer and the mask to be effected at high precision, the pattern transfer mask being applicable to various kinds of lithographic technique such as photolithography and X-ray lithography.

Alignment between a wafer and a mask in a pattern transfer operation has heretofore been effected in such a manner that, as exemplarily shown in FIGS. 1a and 1b, target marks for alignment 5 and 6 provided on a wafer 4 are illuminated with light 9 for alignment, and the reflected light is detected. In this case, the reflected light shows changes in intensity as those shown in FIG. 1b. In the figure: the reference numerals 5' and 5" represent the intensities of reflected light from the target mark 5; 6', the intensity of reflected light from the target mark 6, the reflected light intensity 6' being lowered because the illumination light is scattered by the target mark 6 having a rough surface; 11', the intensity of reflected light 11 from a radiation absorber 2 formed on the mask; and C, a slice level of either the reflected light intensity 5' or 5" from the target mark 5. When the intensity of reflected light from the target mark 5 is at a relatively high level as at 5', alignment can be effected precisely. However, in some processes, the intensity of reflected light from the target mark 5 may be reduced to a level lower than the slice level C as in the case of 5''', which means that satisfactory alignment cannot be effected. In such case, even when the amplification factor of the detector circuit is increased, the ratio between 5" and 6' is so small that it is impossible to carry out stable and effective alignment. In this conventional method, further, the curves of the actually measured reflected light intensity 11' represent mask patterns which are asymmetric with each other as shown in FIG. 1c due to, for example, possible aberration which may occur in the illumination optics and the detection optics. In consequence, if the slice level is changed from C to C', the center position of each of the mask patterns is undesirably shifted by 8, and this is erroneously measured. In addition, the above-described conventional method requires a wafer process step of forming the target mark 6 having a rough surface, which fact leads to a rise in costs. If the reflection factor of the target mark 6 is relatively high, when the reflected light intensity is relatively high as in the aluminum layer forming step the reflected light intensity 6' may reach the same level as that of the intensity 11' of reflected light 11 from the absorber 2, thus making it difficult to effect stable and precise alignment.

These facts are well known, particularly, in semiconductor integrated circuit manufacturing processes using X-ray lithography technique.

SUMMARY OF THE INVENTION

It is an object of the present invention to provide a pattern transfer mask which facilitates alignment in the case where a multiplicity of patterns need to be transferred to one object of pattern transfer.

The present inventors have found that it is possible to effect even more stable alignment by reducing the quantity of the light reflected from the absorber 2 formed on the substrate 1. On the basis of this finding, the present inventors have invented a novel mask which is arranged such that, as exemplarily shown in FIG. 2a, a transfer mask is provided with a thin film 3 which is disposed between a substrate 1 and a radiation absorber 2, thereby reducing the reflected light 11 from the absorber 2 by a large margin. The present inventors also have invented an alignment method using this novel mask. More specifically, a thin film having a large extinction coefficient or a large scattering coefficient is formed between the absorber portion and the substrate, or a thin film having an appropriately selected film thickness is formed on substantially the whole surface of the substrate. For example, when the respective refractive indices of the substrate 1 and the thin film 3 are substantially equal to each other and when the light 9 for alignment is vertically incident on the substrate 1, the intensity I of the reflected light 11 may be expressed as follows:

$$I = 1 - \frac{4n_o n^2 n_g}{n^2(n_o + n_g)^2 - (n_g^2 - n^2)(n^2 - n_o^2)\sin^2\frac{\delta}{2}}$$

where $$\delta = \frac{4\pi n d}{\lambda}$$

n: the refractive indices of the substrate 1 and the thin film 3 d: the sum of the thicknesses of the substrate 1 and the thin film 3

λ: the wavelength of the light 9

$n_g$: the refractive index of the absorber 2 with respect to the wavelength of the light 9

$n_0$: the refractive index of the atmosphere

Accordingly, it is possible to minimize the intensity I of the reflected light 11 by setting the sum of the respective thicknesses of the substrate 1 and the thin film 3 at λ/4n or an odd-number multiple thereof.

Further, the present inventors have found that, when a target mark 8 is formed on a wafer in such a manner that a step or boundary is defined between the mark 8 and the surface of the wafer, the step 18 makes it possible to obtain a sharp and clear positional signal such as that 18' shown in FIG. 2b. In this case, the intensity 11' of the reflected light 11 from the absorber 2 is extremely low. Therefore, it is possible to detect the positional signal 18' at high precision and with ease.

Even when no thin film 3 is provided, the reflected light 11' can be reduced by setting the thickness d' of the substrate 1 as follows:

$$d' = \frac{\lambda}{4n'}(2m + 1)$$

(n': the refractive index of the substrate 1 with respect to the wavelength λ)

It is possible, according to the present invention, to detect the respective positions of an X-ray mask and a semiconductor wafer at high precision irrespective of the reflection factor, so that the production yield of semiconductor devices is advantageously improved.

BRIEF DESCRIPTION OF THE DRAWINGS

FIG. 2b shows the intensity of the reflected light in relation to the arrangement shown in FIG. 2a;

DETAILED DESCRIPTION OF THE PRESENTLY PREFERRED EMBODIMENT

One embodiment of the present invention will be described hereinunder with specific reference to FIGS. 3, 4a and 4b.

Figure 3:
FIG. 3 is a sectional view of a transfer mask in accordance with on embodiment of the present invention.

Referring to FIG. 3, which is a sectional view of one embodiment of the present invention, a mask 20 consists of a support 25, a thin-film substrate 1 having a high X-ray transmission factor, a thin film 3 for preventing reflection, and an X-ray absorber 2. As a material for the thin film 3, chromium oxide may be employed.

A method wherein alignment of a wafer is effected using this transfer mask will be explained below with reference to FIGS. 4a and 4b.

Figure 1A:
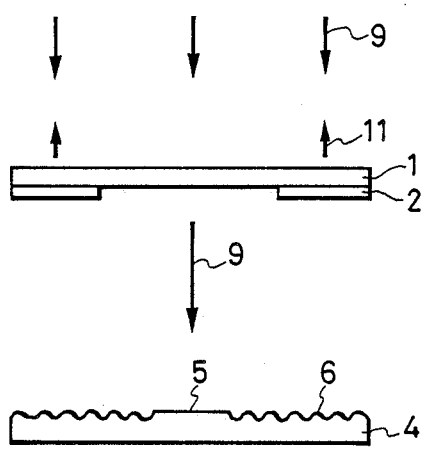
FIGS. 1a, 1b and 1c are views employed to describe the prior art.
Figure 1B:
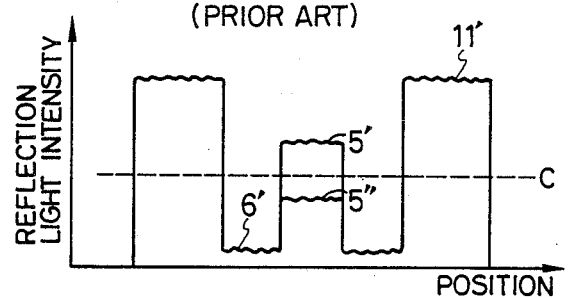
Figure 1C:
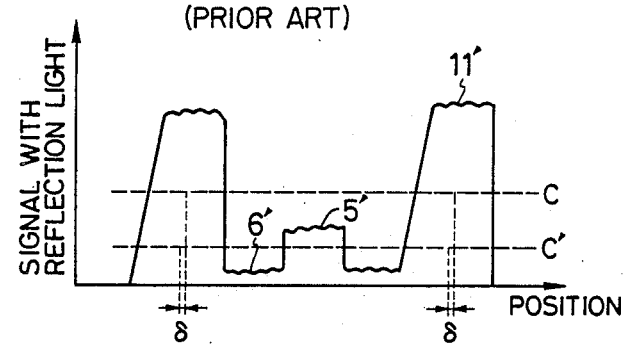
Figure 2A:
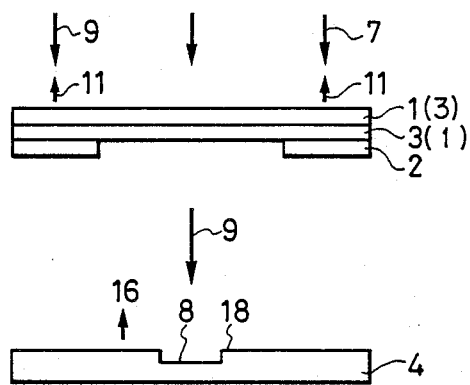
FIG. 2a shows the positional relationship between a transfer mask according to the present invention and a wafer.
Figure 2B:
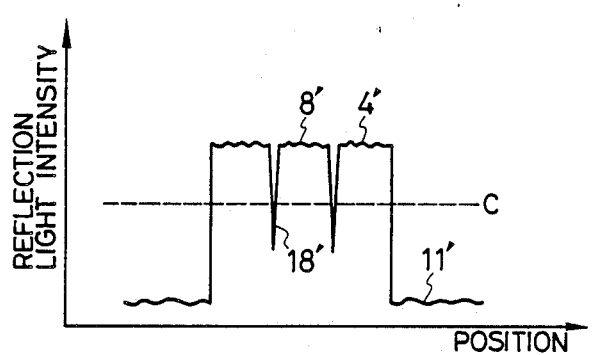
Figure 4A:
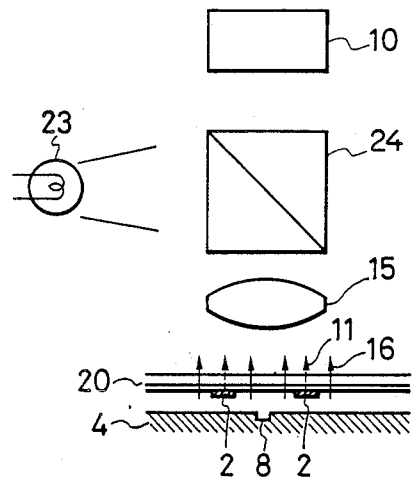
FIGS. 4a and 4b are views employed to describe the embodiment of the present invention.
Figure 4B:
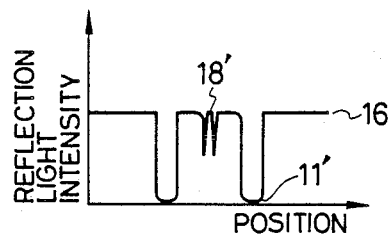

FIG. 4a shows detection optics adopting the beam splitter method. The illumination light from a light source 23 is passed through a beam splitter 24 and an objective lens 15 so as to illuminate the X-ray mask 20 and a semiconductor wafer 4 as shown in FIG. 2a, by the reference numerals in parenthesis. The reflected light from the wafer 4 and the mask 20 is detected by a detector 10 in the form of light intensities corresponding to various positions, as shown in FIG. 4b.

The intensity of reflected light 16 from the semiconductor substrate 4 is considerably higher than the intensity of reflected light 11 from the absorber 2 for alignment formed on the transfer mask 20. In addition, a signal 18' based on a target mark 8 formed on the wafer 4 is favorably clear. Therefore, it is possible to readily detect the relative positions between the mask 20 and the wafer 4. More specifically, the position of the mask 20 is detected from the reflected light intensities 16 and 11', while the position of the wafer 4 is detected from the signal 18'. With this method, even when the reflection factor of the light reflected from the semiconductor substrate 4 lowers as the semiconductor process progresses, as long as the reflected light intensity 16 is higher than the reflected light intensity 11', a clear positional signal such as that shown in FIG. 4b can be obtained by increasing the gain of the detector 10. It is, as a matter of course, possible to obtain a correct and precise positional signal even when the intensity of reflected light 16 from the semiconductor substrate 4 is relatively high as in the aluminum layer forming step.

It should be noted that it was also possible to obtain advantages similar to those described above when the absorber 2 was formed in a so-called Fresnel zone target pattern.

It is not always necessary to make the light for alignment vertically incident on the surface of the transfer mask. It is a matter of course that the above-described numerical formulae and conditions must be changed when the light for alignment is not vertically incident on the mask surface.

The thin film 3 need not be provided on the whole surface of the mask and may be provided only at the are between the absorber 2 and the substrate 1.

As a material for the thin film 3, it is possible to appropriately employ metallic oxides, dielectric films and ceramics such as glass, in addition to the above-described chromium oxide, provided that the material employed is able to form a thin film.

Advantages similar to those described above can be obtained even when the thin film is provided on the side of the substrate which is opposite to the side thereof on which the absorber 2 is formed which penetrate said substrate means and form a pattern of said pattern transfer mask on a wafer.

What is claimed is:

1. A pattern transfer mask comprising:
   substrate means substantially transmissible to radioactive rays which penetrate said substrate means and form a pattern of said pattern transfer mask on a wafer and substantially transmissible to illumination light which is incapable of forming a pattern on said wafer for enabling alignment with said wafer having a step mark, and
   absorber means provided face to face with said wafer on a first side of said substrate means for absorbing said radioactive rays and for enabling alignment with said wafer, said substrate means having a predetermined refractive index and thickness so that when alignment with said wafer is effected by said illumination light incident to a second side of said substrate means opposite said first side of said substrate means, the resultant intensity of the illumination light reflected from said absorber means and the second side of said substrate means is smaller than that of the illumination light reflected from said wafer without passing through said absorber means so as to enable detection of relative position between said absorber means and said step mark of said wafer by detecting steps of the intensities of the illumination light reflected from said wafer, said absorber means and said step mark, respectively.

2. A pattern transfer mark according to claim 1, wherein thickness d of said substrate means is expressed as follows:

$$d = \frac{\lambda}{4n}(2m + 1)$$

($\lambda$: wavelength of said light m: a natural number; h: refractive index of said substrate means with respect to said wavelength).

3. A pattern transfer mask according to claims 1 or 9, wherein said substrate means comprises only a substrate.

4. A pattern transfer mask according to claim 1, wherein said substrate means comprises a substrate and a thin film disposed between said substrate and said absorber means.

5. A pattern transfer mask according to claim 1, wherein said substrate means comprises a substrate and a thin film disposed on said second side of said substrate opposite to a side of said substrate at which said absorber means is disposed.

6. A pattern transfer mask according to claims 4 or 5, wherein a total thickness d of said substrate and said thin film is expressed as follows:

$$d = \frac{\lambda}{4n}(2m + 1)$$

($\lambda$: wavelength of said illumination light m: a natural number; n: refractive index of said substrate with respect to said wavelength when said thin film has a refractive index substantially equal to said substrate).

7. A pattern transfer mask according to claim 1, wherein said radioactive rays are X-rays.

8. A pattern transfer mask according to claim 1, wherein said substrate means comprises a substrate and a thin film disposed only between said substrate and said absorber means.

9. A method of enabling alignment of a wafer and a pattern transfer mask comprising:
   setting a wafer which has a step mark for enabling alignment;
   setting a pattern transfer mask so as to be disposed face to face with said wafer, said pattern transfer mask comprising substrate means substantially transmissible to radioactive rays which penetrate said substrate means and expose said wafer to a pattern of said pattern transfer mask and substantially transmissible to illumination light which is incapable of forming a pattern on said wafer, for enabling alignment with said wafer,
   absorber means provided face to face with said wafer on a first side of said substrate means for absorbing said radioactive rays and for enabling alignment with said wafer, said substrate means having a predetermined refractive index and thickness so that when alignment with said wafer is effected by said illumination light incident to a second side of said substrate means opposite said first side of said substrate means, the resultant intensity of the illumination light reflected from said absorber means and the second side of the substrate means is smaller than that of the illumination light reflected from said wafer without passing through said absorber means so as to enable detection of relative position between said absorber means and said step mark of said wafer by detecting steps of the intensities of the illumination light reflected from said wafer, said absorber means and said step mark, respectively. and absorber means for absorbing said radioactive rays provided face to face with said wafer on a first side of said substrate means for absorbing said radioactive rays and for enabling alignment with said wafer, said substrate means having a predetermined refractive index and thickness so that when alignment with said wafer is effected by said illumination light incident to a second side of said substrate means opposite said first side of said substrate means, the resultant intensity of said illumination light reflected from said absorber means and the second side of said substrate means is smaller than that of said illumination light reflected from said wafer without passing through said absorber means,
   illuminating said wafer through said pattern transfer mask by said illumination light for enabling alignment;
   detecting the intensities of the illumination light reflected from said wafer, said step mark and said absorber means, respectively; and
   detecting relative position between said step mark of said wafer and said absorber means of said pattern transfer mask from steps of said intensities of said detected light.

* * * * *